United States Patent [19]

Calviello

[11] Patent Number: 5,030,579
[45] Date of Patent: Jul. 9, 1991

[54] METHOD OF MAKING ON FET BY ION IMPLANTATION THROUGH A PARTIALLY OPAQUE IMPLANT MASK

[75] Inventor: Joseph A. Calviello, Kings Park, N.Y.

[73] Assignee: Eaton Corporation, Cleveland, Ohio

[21] Appl. No.: 333,140

[22] Filed: Apr. 4, 1989

[51] Int. Cl.$^5$ .......................................... H01L 21/265
[52] U.S. Cl. ......................................... 437/22; 437/44; 437/28; 437/29; 437/45; 437/931
[58] Field of Search ...................... 437/22, 44, 28, 29, 437/45, 931

[56] References Cited

U.S. PATENT DOCUMENTS

| | | | |
|---|---|---|---|
| 3,775,192 | 11/1973 | Beale | 437/931 |
| 4,559,238 | 12/1985 | Bujatti et al. | 437/45 |
| 4,601,096 | 7/1986 | Calviello . | |
| 4,624,004 | 11/1986 | Calviello . | |
| 4,717,683 | 1/1988 | Parrillo et al. | 437/931 |
| 4,724,220 | 2/1988 | Calviello . | |
| 4,737,471 | 4/1988 | Shirato et al. | 437/45 |

FOREIGN PATENT DOCUMENTS

| | | | |
|---|---|---|---|
| 0143576 | 8/1983 | Japan | 437/931 |
| 0050014 | 3/1988 | Japan | 437/28 |

Primary Examiner—Brian E. Hearn
Assistant Examiner—Gordon V. Hugo
Attorney, Agent, or Firm—Andrus, Sceales, Starke & Sawall

[57] ABSTRACT

Semiconductor processing techniques and devices are provided using a partially opaque ion implantation mask to control the profile of active layers in microwave and millimeter wave monolithic integrated circuits. An N+ layer can be implanted before or after active layer formation. Selection of mask thickness enables control of active channel depth. Adjustment of gate to drain separation in MMIC FETs is also enabled, to control gate to drain voltage. Source to gate series resistance is also controlled. Multiple dielectric layers afford variable mask thicknesses to enable simultaneous formation of differing power level devices monolithically in the same substrate, including low noise high speed devices and power devices. The process and device structure provides enhanced yield, performance, uniformity and reliability.

11 Claims, 4 Drawing Sheets

5,030,579

METHOD OF MAKING ON FET BY ION IMPLANTATION THROUGH A PARTIALLY OPAQUE IMPLANT MASK

BACKGROUND AND SUMMARY

The invention relates to semiconductor devices, including microwave and millimeter wave integrated circuits and fabrication methods therefore.

The present invention provides a new approach to manufacture of advanced and cost effective microwave and millimeter wave monolithic integrated circuits (MMICs). The invention adapts partially opaque ion implantation masks to selectively control implantation energy for defining active channel layers in a substrate.

In a particularly desirable aspect, the invention enables fabrication of a microwave and millimeter wave integrated circuit chip having both low noise high speed components and power components monolithically integrated on the same substrate.

In another particularly desirable aspect, the invention enables fabrication of microwave and millimeter wave integrated circuits with plural active channel devices monolithically integrated on the same substrate with uniform pinch-off voltage, which significantly enhances yield and hence cost effectiveness. Uniform pinch-off voltage is provided by uniform depth and vertical area of the active channel, which in turn is enabled by masking structure and methodology relying upon ion implantation energy absorption, not chemical etching. The departure from reliance on chemical etching and the necessary variances thereof in depth and uniformity due to varying surface topologies and impurities, significantly enhances repeatability and reliability. The present invention overcomes prior drawbacks and relies on the energy absorption of a partially opaque ion implantation mask layer to provide uniformity in depth of active channels, and hence uniform, repeatable and reliable pinch-off voltage, which in turn significantly enhances yield of a chip having multiple active channel devices.

In a further aspect, the invention eliminates the need for FET gate recessing, resulting in enhancement of rf performance, reliability, yield, uniformity and repeatability.

In a further aspect, the invention enables increased gate to drain separation in a non-recessed FET, enabling higher voltage. The invention also enables reduced source to gate series resistance, due to increased active layer thickness, and thus provides lower noise and higher gain.

BRIEF DESCRIPTION OF THE DRAWINGS

Prior Art

Present Invention

FIGS. 5-8 show sequence processing steps in accordance with the present invention.

FIGS. 9-12 show sequence processing steps in accordance with an alternative embodiment of the present invention.

FIGS. 13-17 show sequence processing steps in accordance with a further embodiment of the invention.

DETAILED DESCRIPTION

Prior Art

Figure 1:
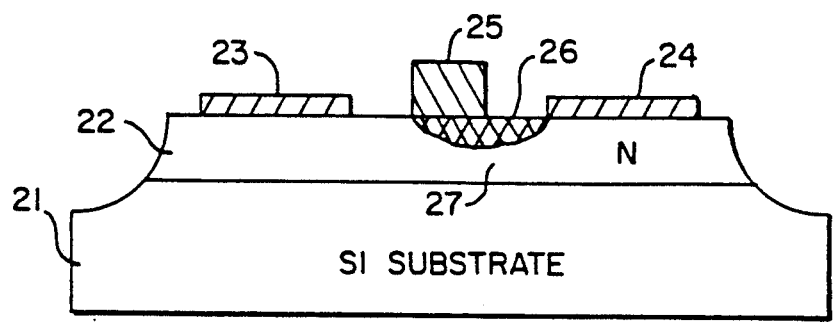
FIG. 1 is a cross-sectional view of a field effect transistor (FET) known in the prior art.
Figure 2:
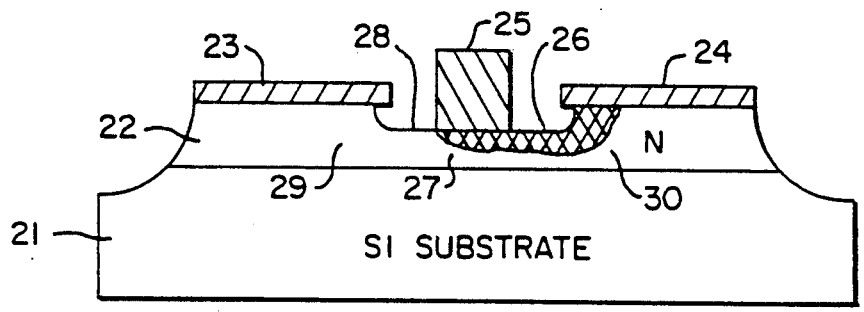
FIG. 2 is a cross-sectional view of another FET known in the prior art.
Figure 3:
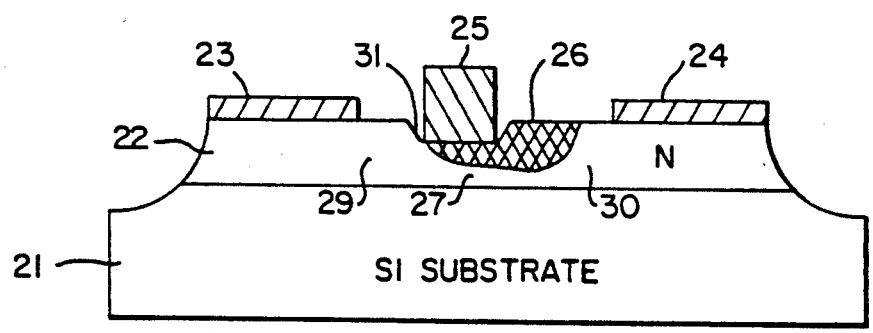
FIG. 3 is a cross-sectional view of another FET known in the prior art.

FIG. 1 shows a field effect transistor (FET) including a semi-insulating substrate 21, an N layer 22, a source contact 23, a drain contact 24, and gate metallization 25. Upon application of increasing potential to gate contact 25, depletion region 26 spreads downwardly toward semi-insulating substrate 21 to pinch-off conduction channel 27, to thus control current conduction from source 23 to drain 24. In microwave and millimeter wave integrated circuits, it is desirable to minimize the pinch-off voltage of active channel 27, and at the same time minimize current resistance of the source and drain regions. One way of accomplishing this objective is shown in FIG. 2, and involves chemical etching of a groove 28 to reduce the vertical height and vertical area of active channel 27. This reduces the vertical height and area of required depletion spreading of region 26 to accomplish pinch-off of channel 27, and hence lower the required pinch-off voltage. However, such chemical etching reduction of channel 27 also reduces the vertical height and vertical area of source and drain regions 29 and 30, which in turn increases current resistance thereof.

In a further prior art embodiment, only that area 31 below gate 25 is chemically etched. This enables larger vertical area of source and drain regions 29 and 30, while still allowing reduced vertical height and area of active channel 27. However, depletion region 26 must still spread through region 30, which has increased vertical height and area, and hence increases pinch-off voltage. Reduced current resistance of the source and drain regions thus requires increased pinch-off voltage.

Figure 4:
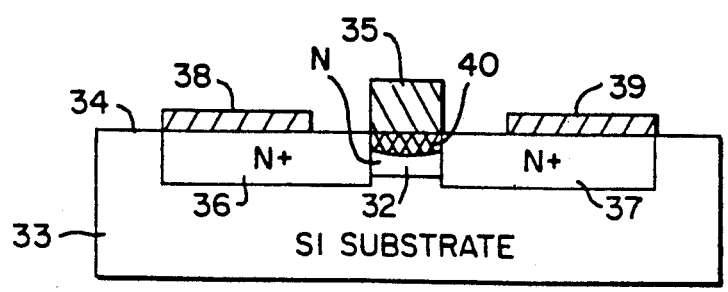
FIG. 4 is a cross-sectional view of another FET known in the prior art.

FIG. 4 shows a self-aligning gate technique known in the prior art. An N layer 32 is formed in semi-insulating substrate 33 over entire upper surface 34, followed by masking with gate metallization 35. The substrate is then ion implanted to for N+ layers 36 and 37. Gate metallization 35 provides a fully opaque ion implantation mask. Source and drain metallization 38 and 39 is then applied. Upon application of voltage to gate metallization 35, depletion region 40 spreads downwardly in N layer 32 towards semi-insulating substrate 33, to pinch-off the conduction channel in region 33 between source region 36 and drain region 37. A drawback of the structure in FIG. 4 is that the gate metallization 35 is immediately adjacent source and drain regions 36 and 37, such that these regions are subject to interdiffusion from metallization layer 35 causing shorting.

The structure and methodology in FIGS. 1-4 is shown and described in U.S. Pat. No(s). 4,601,096, 4,624,004, and 4,724,220, incorporated herein by reference.

Present Invention

Figure 5:
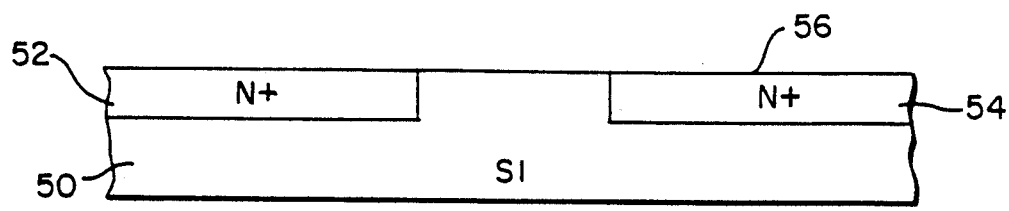
Figure 6:
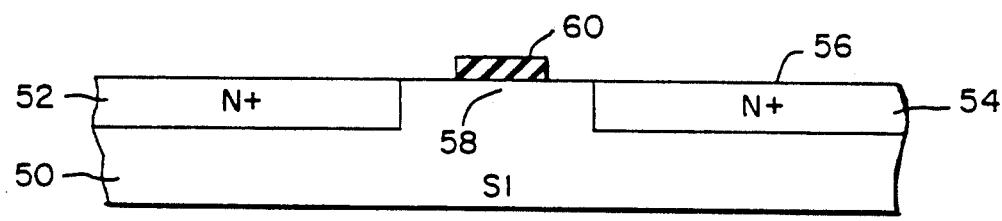
Figure 7:
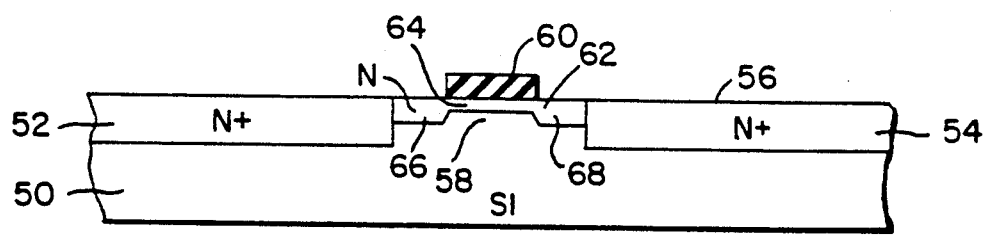
Figure 8:
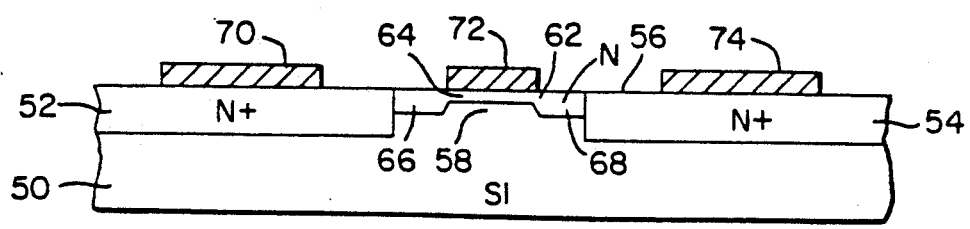

The present invention is illustrated beginning at FIG. 5. A semi-insulating substrate 50, such as gallium arsenide, has left and right N+ regions 52 and 54 formed therein at upper surface 56. A central region 58, FIG. 6, of the substrate is covered by a partially opaque ion implantation mask 60 on upper surface 56. Mask 60 is preferably a dielectric layer such as silicon dioxide or silicon nitride which is thin enough to absorb only part of the ion implantation energy, such that some of the energy reaches the substrate therebelow. Alternatively, thin metallization layers may be used for the mask. The upper surface of the substrate is ion implanted to form a semiconductor layer 62, FIG. 7, of N conductivity type having a first depth at region 64 below mask 60, and a second deeper depth at regions 66 and 68 laterally adjacent region 64. The ion implantation energy is in the range 100 kilovolts to 1 megavolt. The mask thickness is in the range 50–1,000 angstroms. Regions 66 and 68 have larger vertical areas than region 64 to provide reduced current resistance at regions 66 and 68. Region 64 is formed without recessing same from upper surface 56, such that regions 66, 64 and 68 remain coplanar at upper surface 56. Region 64 provides an active channel between source region 52 and drain region 54. Following removal of dielectric layer 60 and after an annealing step, as known in the art, metallization contacts 70, 72, 74 are provided for source region 52, gate region 64, and drain region 54, respectively, FIG. 8. Gate metallization 72 is separated from N+ source region 52 and from N+ drain region 54 by at least the lateral length of respective regions 66 and 68. FIGS. 5–8 show an embodiment eliminating chemical etching to provide the active channel.

Figure 9:
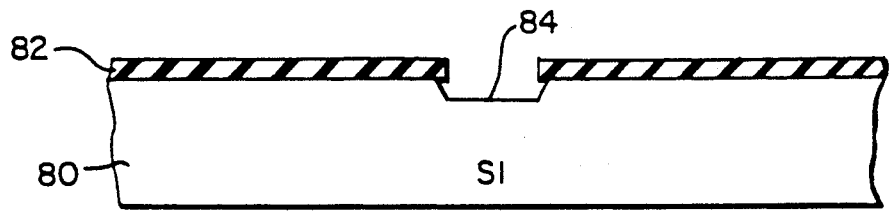
Figure 10:
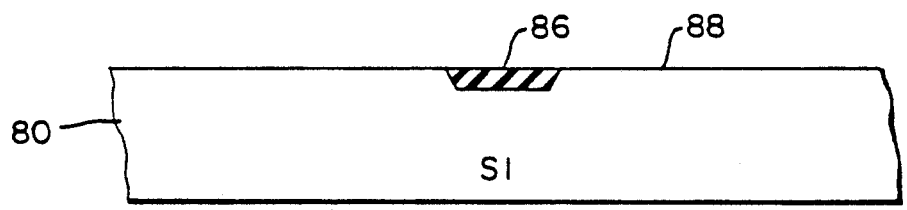
Figure 11:
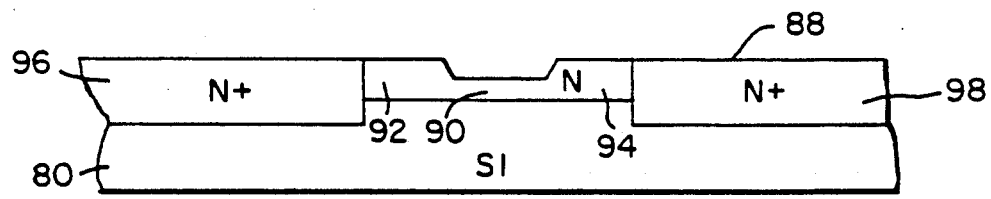
Figure 12:
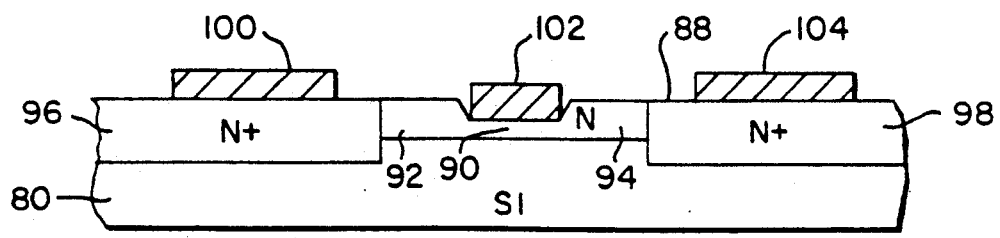

FIGS. 9–12 show an embodiment using chemical etching which may be desired in certain circuit implementations, and which also utilizes the present invention. Semi-insulating gallium arsenide substrate 80, FIG. 9, is masked at 82, and then etched through the mask and into substrate 80 at groove 84, followed by deposition of partially opaque ion implantation mask 86, FIG. 10, and removal of mask 82. Semi-insulating substrate 80 is then ion implanted at its upper surface 88, including through mask 86, to yield N active layer 90 and thicker N layers 92 and 94, followed by removal of mask 86 and deposition of a fully opaque ion implantation mask (not shown), followed by ion implantation to yield N+ regions 96 and 98, FIG. 11, followed by removal of such mask, and deposition of source metallization 100, gate metallization 102 and drain metallization 104, FIG. 12. Gate metallization 102 is separated from N+ source region 96 and from N+ drain region 98 by at least the lateral length of respective regions 92 and 94.

Figure 13:
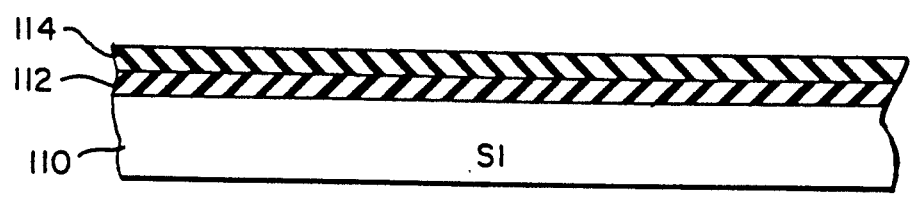
Figure 14:
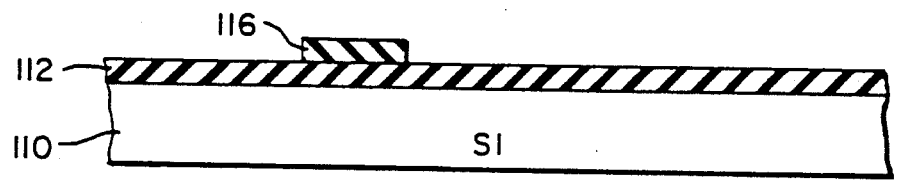
Figure 15:
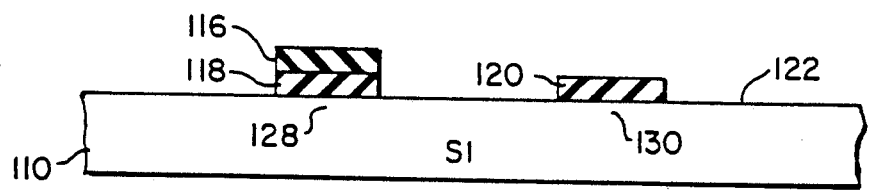
Figure 16:
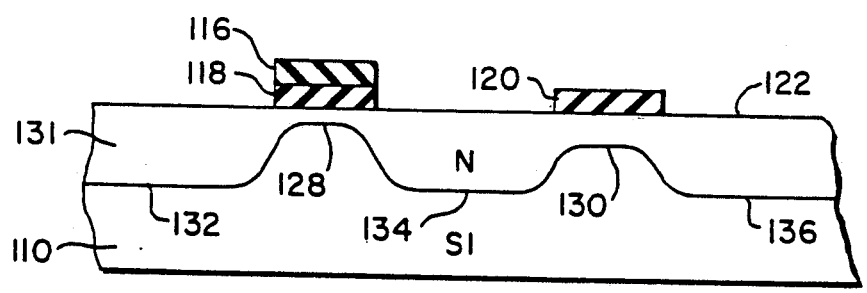
Figure 17:
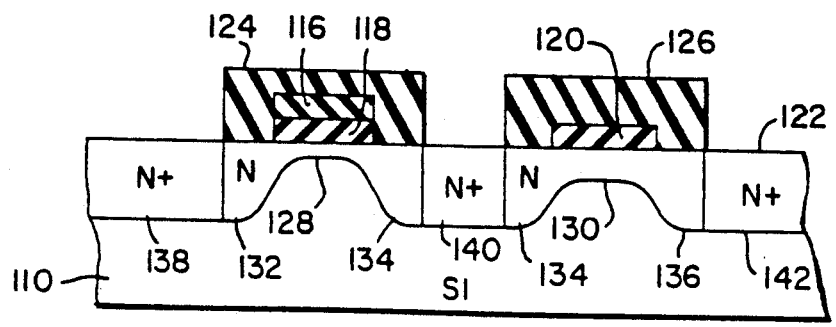

In FIG. 13, semi-insulating gallium arsenide substrate 110 has a silicon dioxide layer 112 deposited thereon, followed by deposition of a silicon nitride layer 114. The silicon nitride layer 114 is then selectively etched, using chemical or dry etch processes known in the art, to yield mask portion 116, FIG. 14, followed by etching of silicon dioxide layer 112 to yield masks 118 and 120, FIG. 15. Layers 112 and 114, FIG. 13, are deposited to a thickness thin enough to be partially opaque to ion implantation, such that masks 116, 118 and 120 are partially opaque to ion implantation. Region 128 of the substrate is covered by partially opaque ion implantation mask 116, 118 on upper surface 122. Region 130 of the substrate is covered by partially opaque ion implantation mask 120 on upper surface 122 having an energy absorption less than mask 116, 118. Upper surface 122 of semi-insulating substrate 110 is ion implanted, including region 128 through mask 116, 118, and region 130 through mask 120, to form an N semiconductor layer 131, FIG. 16, having a first depth at region 128 below mask 116, 118, a second deeper depth at region 130 below mask 120, and a third yet deeper depth at third, fourth and fifth regions 132, 134 and 136, respectively. Third region 132 is laterally adjacent and left of region 128. Region 134 is laterally adjacent and between regions 128 and 130. Region 136 is laterally adjacent and right of region 130. Region 128 and portions of regions 132 and 134 are covered with a photoresist mask 124 which is fully opaque to ion implantation, FIG. 17. Region 130 and portions of regions 134 and 136 adjacent thereto are covered during the same masking operation with photoresist mask 126 which also is fully opaque to ion implantation. Upper surface 122 of substrate 110 is further ion implanted to form a further semiconductor layer of N+ conductivity type having a region 138 in a leftward portion of region 132 uncovered by mask 12, an N+ region 140 in a central portion of region 134 uncovered by masks 124 and 126, and an N+ region 142 in a rightward portion of region 136 uncovered by mask 126. The photoresist is then removed, followed by an annealing step, as known in the art, followed by deposition of contact metallization.

The method and structure of FIGS. 13–17 enables the noted simultaneous fabrication of both low noise high speed components, such as at active channel 128 with a 0.5 to 3 volt pinch-off, and power components, such as at active channel 130 with a 5 to 7 volt pinch-off, on the same substrate.

The invention also enables fabrication of microwave and millimeter wave integrated circuits with plural active channel devices monolithically integrated on the same substrate with uniform pinch-off voltage, which significantly enhances yield and cost effectiveness. Uniform pinch-off voltage is provided by uniform depth and vertical area of the active channel such as 64 in FIGS. 5–9, and 128 in FIGS. 13–17, which in turn is enabled by the masking structure and methodology relying upon ion implantation energy absorption, not chemical etching. The active channel depth is highly uniform and reliably repeated from channel to channel and over the full diameter of the wafer, thus providing uniform pinch-off voltage of the channels, which in turn significantly enhances yield of a chip having multiple active channel devices.

The invention thus provides a method for forming microwave and millimeter wave integrated circuits with plural active channel devices monolithically integrated on the same substrate with highly accurately controlled, repeatable and reliable pinch-off voltages. Designated regions of the upper surface of the semi-insulating substrate are covered with a partially opaque ion implantation mask of given energy absorption. The upper surface of the substrate is ion implanted, including the designated regions through the mask, to form a semiconductor layer of given conductivity type having a designated depth at the designated regions below the mask. The depth is controlled by the energy absorption of the mask to accurately control the depth without relying on chemical etching. The semiconductor layer has a second deeper depth at second regions laterally adjacent the noted designated regions and uncovered by the mask. The invention may of course be expanded to more than just two types of devices simultaneously formed on the same substrate, and to more than two layer depths, e.g. third, fourth, etc. layer depths may be provided simultaneously on the same substrate by use of the invention.

As shown in FIGS. 9–12, the invention is adaptable to use with chemical etching, if desired in certain applications.

The invention further provides a method for forming a microwave and millimeter wave FET having low source and drain resistance without high pinch-off voltage.

The invention also provides the above noted gate to drain lateral spacing, for increased gate to drain voltage. The invention also enables reduced source to gate series resistance, due to increased active layer thickness, and thus provides lower noise and higher gain.

It is recognized that various equivalents, alternatives and modifications are possible within the scope of the appended claims.

What is claimed is:

1. A semiconductor processing method comprising providing a substrate having an upper surface, covering a first region of said substrate with a partially opaque ion implantation mask on said upper surface, ion implanting said upper surface of said substrate, including said first region through said mask, to form a semiconductor layer of N conductivity type having a first depth at said first region below said mask, and a second deeper depth at a second region laterally adjacent said first region, and forming in a separate step a third region of N+ conductivity type laterally adjacent said second region.

2. The invention according to claim 1 comprising forming said third region prior to said ion implanting step forming said first and second regions.

3. A semiconductor processing method comprising providing a substrate having an upper surface, covering a first region of said substrate with a partially opaque ion implantation mask on said upper surface, ion implanting said upper surface of said substrate, including said first region through said mask, to form a semiconductor layer of given conductivity type having a first depth at said first region below said masks, and a second deeper depth at a second region of said substrate with a second partially opaque ion implantation mask of lesser energy absorption than said first mentioned mask, and during said ion implanting step, also ion implanting said third region through said second mask, such that said semiconductor layer of given conductivity type has a third depth at said third region which is deeper than said first depth and shallower than said second depth.

4. A method for forming microwave and millimeter wave integrated circuits having both low noise high speed active channel components and power active channel components monolithically integrated on the same substrate, comprising providing a semi-insulating substrate having an upper surface, covering a first region of said semi-insulating substrate with a first partially opaque ion implantation mask on said upper surface, covering a second region of said semi-insulating substrate with a second partially opaque ion implantation mask on said upper surface having a lesser energy absorption than said first mask, ion implanting said upper surface of said substrate, including said first region through said first mask and said second region through said second mask, to form a semiconductor layer of given conductivity type having a first depth at said first region below said first mask, a second deeper depth at said second region below said second mask, and a third yet deeper depth at third regions laterally adjacent said first and second regions, said first region providing a low noise high speed active channel, said second region providing a power active channel.

5. A method for forming microwave and millimeter wave monolithic integrated circuits comprising, providing a semi-insulating substrate having an upper surface, covering a first region of said substrate with a first partially opaque ion implantation mask on said upper surface of given energy absorption, covering a second region of said substrate with a second partially opaque ion implantation mask on said upper surface and having an energy absorption less than said first mask, ion implanting said upper surface of said substrate, including said first region through said first mask, and said second region through said second mask, to form a semiconductor layer of given conductivity type having a first depth at said first region below said first mask, a second deeper depth at said second region below said second mask, and a third yet deeper depth at third, fourth and fifth regions, said third region being laterally adjacent and left of said first region, said fourth region being laterally adjacent and between said first and second regions, said fifth region being laterally adjacent and right of said second region, covering said first region and portions of said third and fourth regions adjacent thereto with a third mask fully opaque to ion implantation, covering said second region and portions of said fourth and fifth regions adjacent thereto with a fourth mask fully opaque to ion implantation, further ion implanting said upper surface of said substrate to form a further semiconductor layer of said given conductivity type having a sixth region in a left portion of said third region uncovered by said third mask, a seventh region in a central portion of said third region uncovered by said third and fourth masks, and an eighth region in a right portion of said fifth region uncovered by said fourth mask.

6. A method for forming a microwave and millimeter wave FET having low source and drain resistance without high pinch-off voltage, comprising providing a semi-insulating substrate having an upper surface, forming laterally spaced source and drain regions of N+ conductivity type in said semi-insulating substrate at said upper surface, said source and drain regions being separated by a portion of said semi-insulating substrate therebetween, said last mentioned portion of said semi-insulating substrate having a central region between left and right regions, said left region abutting said source region on the left, said right region abutting said drain region on the right, covering a portion of said central region of said semi-insulating substrate with a partially opaque ion implantation mask on said upper surface, ion implanting said upper surface of said substrate, including said central region through said mask, and including said left and right regions, to form a semiconductor layer of N conductivity type having a first depth at said central region below said mask, and having second deeper depths at said left and right regions on each side of said central region, to provide a reduced vertical area pinch-off channel at said central region, and to provide an increased vertical area at said left region for reduce current resistance therethrough from said source region, and to provide an increased vertical area at said right region for reduce current resistance therethrough to said drain region in between said N+ source and drain regions.

7. A method for forming a microwave and millimeter wave FET having low source and drain resistance without high pinch-off voltage, comprising providing a semi-insulating substrate having an upper surface, covering a central region of said substrate with a partially opaque ion implantation mask on said upper surface, ion implanting said upper surface of said substrate, including said central region through said mask, to form a semiconductor layer of N conductivity type having a first depth at said central region below said mask, and second deeper depths at left and right regions on opposite lateral sides of said central region, covering said left, central and right regions of said substrate with a fully opaque ion implantation mask, further ion implanting said upper surface of said substrate to form a further semiconductor layer of N conductivity type having source and drain regions on opposite lateral sides of said left and right regions, respectively.

8. The invention according to claim 1 comprising forming said third region after said ion implanting step forming said first and second regions.

9. A method for forming an active channel region in microwave and millimeter wave monolithic integrated circuits on a semi-insulating substrate having an upper surface, comprising covering a first region of said substrate with a partially opaque ion implantation mask on said upper surface, ion implanting said upper surface of said semi-insulating substrate, including said first region through said mask, to form a semiconductor layer of N conductivity type having a first depth at said first region below said mask to form said channel, and a second deeper depth at a second region laterally adjacent said first region, and forming in a separate step a third region of N+ conductivity type laterally adjacent said second region.

10. The invention according to claim 9 comprising forming said third region prior to said ion implanting step forming said first and second regions.

11. The invention according to claim 9 comprising forming said third region after said ion implanting step forming said first and second regions.

* * * * *